United States Patent
Ito (10) Patent No.: US 7,098,127 B2
(45) Date of Patent: Aug. 29, 2006

(54) SEMICONDUCTOR DEVICE, METHOD FOR MANUFACTURING THE SAME, CIRCUIT SUBSTRATE, ELECTRO-OPTICAL APPARATUS, AND ELECTRONIC EQUIPMENT

(75) Inventor: Haruki Ito, Chino (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/726,275

(22) Filed: Dec. 2, 2003

(65) Prior Publication Data

US 2004/0145031 A1 Jul. 29, 2004

(30) Foreign Application Priority Data

Dec. 2, 2002 (JP) ............................. 2002-350337

(51) Int. Cl.
*H01L 21/44* (2006.01)

(52) U.S. Cl. ...................... 438/614; 438/623; 438/678

(58) Field of Classification Search ................ 438/612, 438/613, 614, 622–625, 674, 678, 687–688
See application file for complete search history.

(56) References Cited

U.S. PATENT DOCUMENTS

| | | | |
|---|---|---|---|
| 5,877,556 A | 3/1999 | Jeng et al. | |
| 6,051,489 A | 4/2000 | Young et al. | |
| 6,084,301 A | 7/2000 | Chang et al. | |
| 6,097,091 A | 8/2000 | Ohsumi | |
| 6,458,682 B1 * | 10/2002 | Watanabe | ................... 438/612 |

FOREIGN PATENT DOCUMENTS

| | | | |
|---|---|---|---|
| JP | 356164556 | * | 12/1981 |
| JP | 02-272737 | | 11/1990 |
| JP | 404030533 A | * | 2/1992 |
| JP | 05-243231 | | 9/1993 |
| JP | 08-195397 | | 7/1996 |
| JP | 11-233545 | | 8/1999 |
| JP | 11-307563 | | 11/1999 |
| JP | 2000-299406 | | 10/2000 |
| JP | 2001-110831 | | 4/2001 |
| JP | 2001-196403 | | 7/2001 |
| JP | 2002-299341 | | 10/2002 |
| KR | 1998-086518 | | 12/1998 |
| WO | WO 0077843 | | 12/2000 |

OTHER PUBLICATIONS

Communication from Chinese Patent Office regarding related application.

* cited by examiner

*Primary Examiner*—Thanhha Pham
(74) *Attorney, Agent, or Firm*—Harness, Dickey & Pierce, P.L.C.

(57) ABSTRACT

A semiconductor device is provided with a plurality of protrusions which are made of a resin and which protrude higher than electrodes, and conductive layers which are electrically connected to the electrodes and which cover the top surfaces of the protrusions. A method for manufacturing the semiconductor device includes a step of applying a layer of the resin to the semiconductor device except for the electrodes, a step of patterning the conductive layers on the electrodes and the layer of the resin in accordance with the protrusions, and a step of removing the layer of the resin located between the conductive layers by the use of the patterned conductive layers as masks so as to form the protrusions.

4 Claims, 7 Drawing Sheets

SEMICONDUCTOR DEVICE, METHOD FOR MANUFACTURING THE SAME, CIRCUIT SUBSTRATE, ELECTRO-OPTICAL APPARATUS, AND ELECTRONIC EQUIPMENT

BACKGROUND OF THE INVENTION

1. Technical Field of the Invention

The present invention relates to a semiconductor device, a method for manufacturing the same, a circuit substrate, an electro-optical apparatus, and electronic equipment.

2. Description of the Related Art

Conventionally, so-called Au bumps are frequently used for mounting semiconductor devices, e.g., driver ICs. In the formation of the Au bump, a seed layer made of TiW/Au or the like is sputtered on a semiconductor element, a resist is patterned and, thereafter, Au electroplating is applied up to a height on the order of 20 μm. However, it is predicted that stable formation of bumps, such as formation of a resist having a high aspect ratio, etching of a seed layer, and the like, becomes difficult with a reduction in the pitch of the electrodes of the above-described driver IC.

In recent years, an inexpensive electroless Ni bump was developed in response to the reduction in pitch. However, this bump is harder than the Au bump and, therefore, may be unsuitable, particularly for COG (Chip On Glass) techniques in which the driver IC is directly mounted on a display panel, from the viewpoint of the reliability of connection.

Japanese Unexamined Patent Application Publication No. 2-272737 discloses a technology in which resin protrusions are disposed in the locations at a distance from electrodes, connection patterns for serving as conductive layers are disposed to cover and connect the surfaces of the protrusions and the electrodes and, thereby, protrusion electrodes are provided. According to this technology, protrusion electrodes having small diameters can easily be formed, and a reduction in semiconductor chip size is facilitated. In addition, the stress during mounting is absorbed because the resin protrusions have elasticity and, therefore, stabilization in mounting quality is facilitated.

However, the above-described known technology has problems as described below.

In the formation of the protrusion electrodes, it is necessary to perform patterning after a semiconductor element is coated with a resin, form a conductive layer by sputtering or the like and, furthermore, pattern the resulting conductive layer. In the known patterning, since a desired shape is given by, for example, photo-etching, a photomask or the like suitable for the desired shape must be prepared on an etching step basis and, therefore, the manufacturing cost is increased. There is a further problem in that fine patterning is required for both of the resin layer and the conductive layer, and the manufacturing process becomes complicated.

When a plurality of protrusions are formed by photo-etching, the spacings between protrusions may be formed into tapered shapes. In this case, the spacings between base portions of the protrusions become small, and it may become difficult to respond to a reduction in the pitch of the protrusions.

The present invention was made in consideration of the above-described points. It is an object of the present invention to provide a semiconductor device and a method for manufacturing the same capable of simplifying the manufacturing process and responding to a reduction in pitch, and to provide a circuit substrate, an electro-optical apparatus, and electronic equipment.

SUMMARY

In order to achieve above-described objects, the present invention adopts the following configuration.

A method according to the present invention is for manufacturing a semiconductor device including electrodes, a plurality of protrusions which protrude higher than the electrodes and which are made of a resin in a predetermined pattern, and conductive layers which are electrically connected to the electrodes and which cover the top surfaces of the protrusions. The method includes the steps of applying a layer of the resin to the semiconductor device except for the electrodes; patterning the conductive layers on the electrodes and the layer of the resin in accordance with the predetermined pattern of the protrusions; and removing the of the resin located between the conductive layers by the use of the patterned conductive layers as masks, so as to form the protrusions.

In the present invention, since the conductive layers are used as masks in patterning of the plurality of protrusions by removing the layer of the resin located between the conductive layers through the use of etching or the like, fine patterning of the layer of the resin is unnecessary and, therefore, the manufacturing process can be simplified. Preferably, this layer of the resin is removed by plasma processing. In this case, since the side surfaces of the protrusions which have a high probability of taking on tapered shapes are caused to become substantially perpendicular, spacings between the base portions of the protrusions adjacent to each other do not become small. Consequently, a reduction in pitch can be realized with respect to the disposition of the plurality of protrusions.

The conductive layer may be formed by sputtering or plating in the configuration adopted. With respect to the formation by sputtering, since a resist remaining on the conductive layer can be simultaneously removed during the plasma processing performed after the conductive layer is patterned using the resist, no separate resin removal step is required. With respect to the formation by plating, since the conductive layer can have a large thickness, a break and the like can be prevented.

The step of forming the conductive layers may includes a sub-step of forming first conductive layers covering the electrodes before the layer of the resin is formed and a sub-step of forming second conductive layers connecting the surface of the layer of the resin and the first conductive layers. In this case, since the electrodes can be covered (coated) with the first conductive layer, corrosion of the electrodes can be prevented, in contrast to the case where Al electrodes are used. Preferably, the first conductive layer is formed by electroless nickel plating. The first conductive layer and the second conductive layer may be formed by sputtering. In this case, since the first conductive layer can be extended to the active surface region of the semiconductor device, flexibility in formation of the protrusions can be further increased.

A semiconductor device according to the present invention is manufactured by the above-described method for manufacturing a semiconductor device. A circuit substrate according to the present invention includes the above-described semiconductor device. In this manner, mounting can be performed with a reduced pitch in the present invention and, thereby, a high-performance semiconductor device and circuit substrate can be prepared.

An electro-optical apparatus according to the present invention is provided with an electro-optical panel and the above-described semiconductor device electrically connected to the above-described electro-optical panel. Electronic equipment according to the present invention is provided with the above-described electro-optical apparatus.

According to the present invention, mounting can be performed with a reduced pitch and, thereby, a high-performance electro-optical apparatus and electronic equipment including semiconductor devices mounted thereon with a reduced pitch and at a high density can be prepared.

DETAILED DESCRIPTION

The embodiments of the semiconductor device, the method for manufacturing the same, the circuit substrate, the electro-optical apparatus, and the electronic equipment according to the present invention will be described below with reference to FIG. 1 to FIG. 10. Here, the structure of the semiconductor device used in the manufacturing method of the present invention and an example of the manufacturing process thereof will be described in advance of descriptions of steps specific to the present invention.

Figure 1:
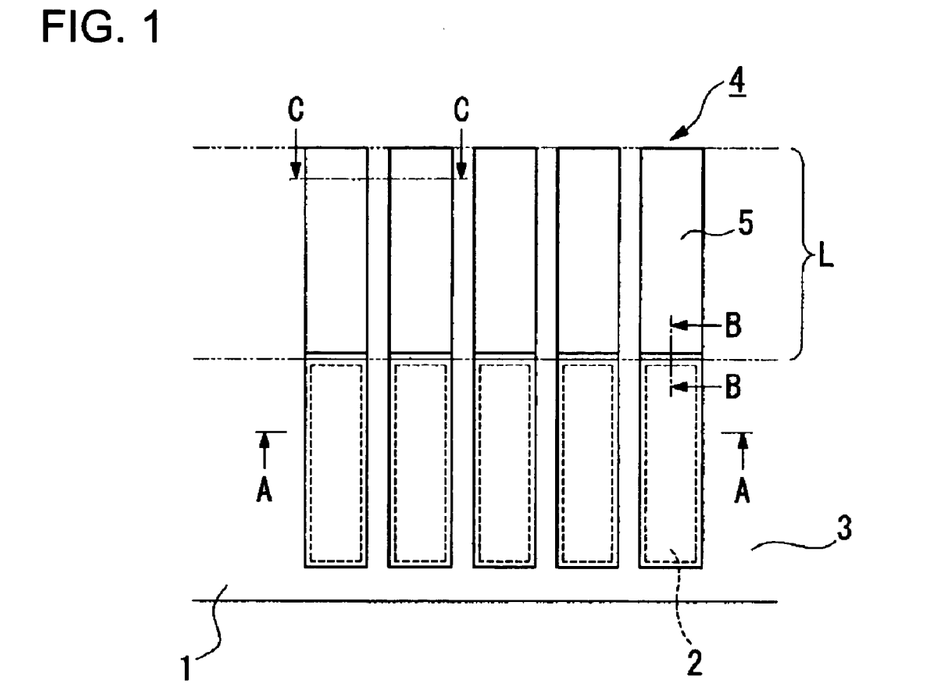
FIG. 1 is a partial plan view of a semiconductor device according to the present invention.
Figure 2:
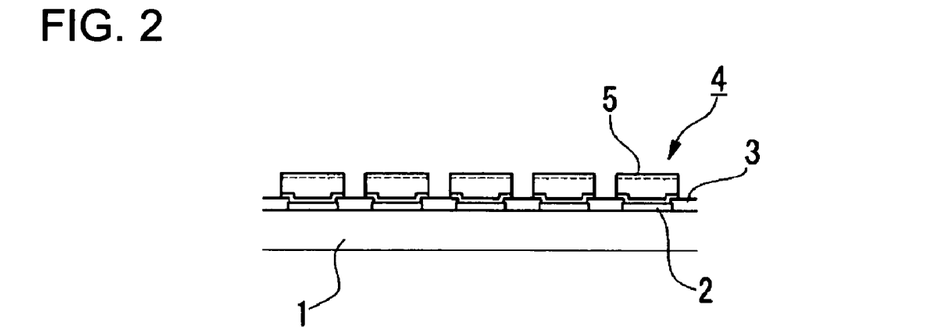
FIG. 2 is a sectional view of the section indicated by a line A—A shown in FIG. 1.
Figure 3:
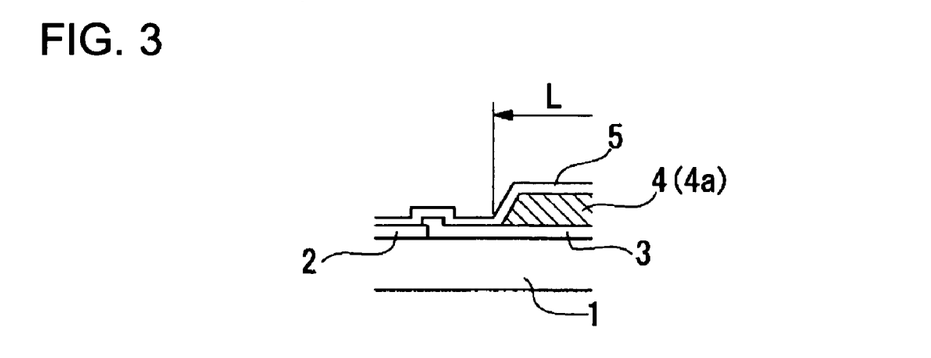
FIG. 3 is a sectional view of the section indicated by a line B—B shown in FIG. 1.

FIG. 1 is a partial plan view of a semiconductor element serving as a semiconductor device according to the present invention. FIG. 2 is a sectional view of the section indicated by a line A—A shown in FIG. 1. FIG. 3 is a sectional view of the section indicated by a line B—B shown in FIG. 1. The semiconductor element in the present embodiment may be a semiconductor substrate, e.g., a silicon wafer in a condition in which a plurality of semiconductor chips are provided, or may be an individual semiconductor chip. The semiconductor chip is usually a rectangular parallelepiped (including a cube). However, the shape is not so limited, and may be spherical.

In FIG. 1, reference numeral 1 denotes a semiconductor element (semiconductor device), reference numeral 2 denotes an Al electrode provided on the semiconductor element 1 in order to input and output electric signals, reference numeral 3 denotes a passivation film provided to protect an active surface of the semiconductor element 1, reference numeral 4 denotes a protrusion made of a resin while the protrusions are disposed with the same pitch as that of the Al electrodes 2, and reference numeral 5 denotes a conductive layer (metal film) provided to cover the Al electrode 2 and the surface (top surface) of the protrusion 4.

The Al electrode 2 is formed by, for example, sputtering, and is patterned into a predetermined shape (e.g., the shape of a rectangle) by the use of a resin or the like. In the present embodiment, the case where electrodes are composed of Al electrodes is described as an example. However, the electrode may have a structure in which, for example, a Ti (titanium) layer, a TiN (titanium nitride) layer, an AlCu (aluminum/copper) layer, and a TiN layer (cap layer) are laminated in that order. The electrode is not limited to the above-described configuration, and the configuration may be appropriately changed in accordance with the required electrical characteristics, physical characteristics, and chemical characteristics.

A plurality of Al electrodes 2 are provided in the vicinity of the edge of the semiconductor element 1 with a predetermined pitch. The passivation film 3 is provided in order to cover the periphery of the Al electrodes 2. This passivation film 3 may be made of $SiO_2$ (silicon oxide), SiN (silicon nitride), a polyimide resin, or the like. The thickness of the passivation film 3 is, for example, in the order of 1 μm.

A plurality of protrusions 4 are provided in the active surface side of the Al electrodes 2, and are aligned in the horizontal direction in FIG. 1 with the same pitch as that of the Al electrodes 2. The protrusions 4 protrude (for example, with a thickness of 1 to 30 μm) higher than the Al electrodes 2. The protrusion 4 may be made of a resin, e.g., a polyimide resin, a silicone-modified polyimide resin, an epoxy resin, a silicone-modified epoxy resin, benzocyclobutene (BCB), or polybenzoxazole (PBO).

The conductive layer 5 may be formed from a metal, e.g., Au, TiW, Cu, Cr, Ni, Ti, W, NiV, or Al, or be formed by laminating some of these metals. Preferably, the conductive layer 5 (when having a laminated structure, at least one layer) is formed from a material, e.g., Cu, TiW, or Cr, having a corrosion resistance higher than that of the Al electrode 2. In this manner, corrosion of the Al electrode 2 can be prevented, and electrical failure can be prevented.

Steps of forming the protrusions 4 on the semiconductor element 1 having the above-described configuration will be sequentially described with reference to FIGS. 4(a) to (d). FIGS. 4(a) to (d) are sectional views of a cross section of the portion where protrusions 4 and 4 are adjacent to each other in the alignment direction (a sectional view of a cross section indicated by a line C—C in FIG. 1). In the drawing, alternate long and short dashed lines indicate each position where the protrusions 4 are to be provided.

Although not shown in the drawing, a coating of a resist is applied all over the passivation film 3 by a spin coating method, a dipping method, a splay coating method, or the like, the resist is patterned into a predetermined shape through an exposure treatment and a development treatment by the use of a mask formed into a predetermined pattern, the resist is patterned into a predetermined shape, and a part of the passivation film 3 covering the Al electrode 2 is etched to form openings, so that the passivation film 3 is patterned. Preferably, dry etching is used.

The dry etching may be reactive ion etching (RIE). Wet etching may also be used.

Figure 4A:
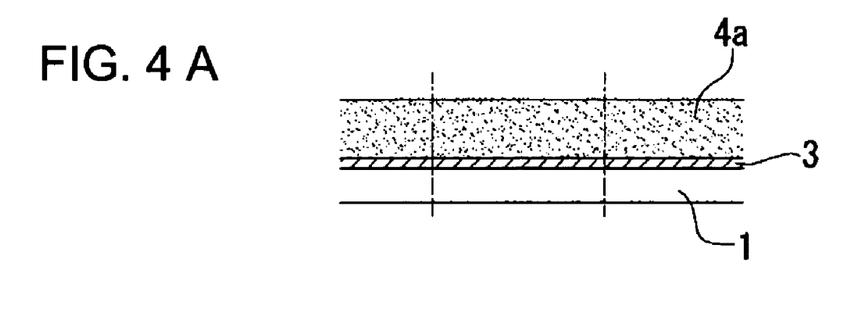
FIGS. 4(a) to 4(d) are diagrams showing the manufacturing process of protrusions.
Figure 4B:
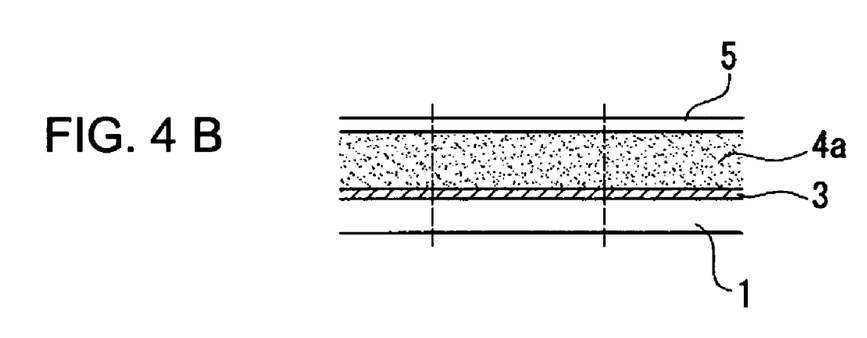

As shown in FIG. 4(a), the above-described resin (for example, polyimide) constituting the protrusion 4 is applied to the passivation film 3 provided on the semiconductor element 1, so that the resin layer 4a is formed. At this time, as shown in FIG. 1 and FIG. 3, the resin layer 4a is patterned all over the range L except for the regions immediately above the openings of the Al electrodes 2 (in the present embodiment, the Al electrodes 2 and the resin layer 4 are completely separated).

As shown in FIG. 4(*b*), the conductive layer 5 (for example, TiW/Au) is formed all over the surface of the semiconductor element 1 including the Al electrodes 2 and the surface (top surface) of the resin layer 4*a*. A sputtering or plating treatment may be adopted as the method for manufacturing the conductive layer 5. When the plating treatment is performed, the layer formed in this step serves as a seed layer.

Figure 4C:
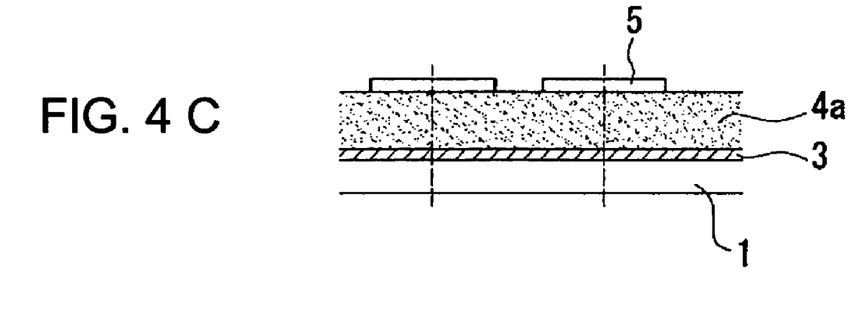

A resist coating is applied all over the conductive layer 5 by a spin coating method, a dipping method, a spray coating method, or the like, and the resist is patterned into a predetermined shape through an exposure treatment and a development treatment by the use of a mask provided with openings corresponding to the two-dimensional shape (two-dimensional pattern) of the conductive layer 5. Subsequently, an etching treatment is performed, so that each conductive layer 5 is provided by patterning in the location corresponding to that of a protrusion, as shown in FIG. 4(*c*). Thereafter, a step of peeling the remaining resist(on the conductive layer 5) resin is performed. However, this peeling step is unnecessary if the conductive layer 5 is a film simply formed by sputtering. A film may be formed by a plating treatment (for example, Au plating; a thickness of 0.5 to 10 μm). on the film formed by sputtering and, therefore, the conductive layer 5 may be composed of these laminated plural films. In this case, the steps of sputtering, resist application, plating, resist peeling, and etching are performed in sequence.

Figure 4D:
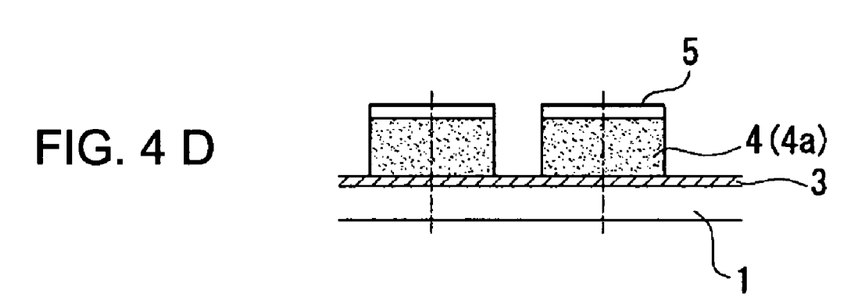

With respect to the resin layer 4*a*, resin layers exposed at the regions located between the conductive layers 5 are removed by etching. A plasma treatment (plasma processing) is preferable as the method for etching, and the exposed resin layer 4*a* is removed by, for example, $O_2$ plasma. At this time, since the conductive layers 5 serve as masks, the resins located between the conductive layers 5 can be removed without using a separately prepared element, such as a photomask. As shown in FIG. 4(*d*), unnecessary resins on the semiconductor element 1 are removed by this plasma etching, and the protrusions 5 (protrusion electrodes) are formed while the conductive layers 5 connected to the Al electrodes 2 are provided on the surface (top surface) thereof.

When the resin layer 4*a* is removed by photo-etching, the spacings between protrusions 4 and 4 adjacent to each other are formed into tapered shapes with a high probability, and spacings between base portions of the protrusions 4 become smaller than the distances between the conductive layers 5. Consequently, it is practically difficult to reduce the pitch of the protrusions 4. However, when the plasma etching is performed, protrusions 4 having substantially perpendicular side surfaces can be formed and, thereby, it is possible to respond to a reduction in pitch of the protrusions 4. Furthermore, when the conductive layer 5 is a film simply formed by sputtering, the resist remaining on the conductive layer 5 is removed by this plasma etching simultaneously with the resin layer 4*a*.

As described above, in the semiconductor device and the method for manufacturing the same according to the present embodiment, the protrusions 4 are formed by removing the resin layer 4*a* through the use of the patterned conductive layers 5 as masks. Consequently, the protrusions 4 can easily be formed and, in addition, preparation of any fine-pattern mask for patterning the protrusions 4 is unnecessary, so that prevention of an increase in manufacturing cost can be facilitated. In the present embodiment, since the removal of the resin layer for forming the protrusions is performed by the plasma etching, protrusions 4 having substantially perpendicular side surfaces can be formed and, thereby, it is possible to respond to a further reduction in pitch of the protrusions 4. In the present embodiment, when the conductive layer 5 is a film simply formed by sputtering, the remaining resist accompanying the formation of the conductive layer can be simultaneously peeled by the plasma treatment. Therefore, no separate peeling step is required, so that an improvement of the manufacturing efficiency can also be facilitated.

Another form of the method for manufacturing a semiconductor device according to the present invention will be described below.

Figure 11:
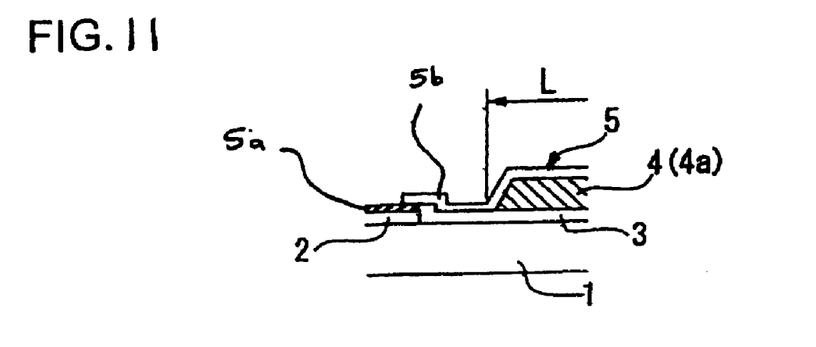
FIG. 11 is a sectional view of the section indicated by a line B—B shown in FIG. 1 showing a conductive layer comprising a first layer and a second layer.

In the configuration of the above-described embodiment, the conductive layer 5 directly connects the Al electrode 2 and the surface of the protrusion 4 and includes a first conductive layer 5*a* and a second conductive layer 5*b*. However, indirect connection may be adopted as shown in FIG. 11. Specifically, the first conductive layer 5*a* is formed in order to cover the Al electrode 2 before the formation of the resin layer 4*a* by the above-described manufacturing method and, thereby, the resin layer 4*a* is formed on regions except for the regions immediately above the Al electrodes 2. Once the resin layer 4*a* is formed, the second conductive layer 5*b* is formed. Examples of methods for manufacturing the first conductive layer 5*a* include an electroless nickel plating treatment, sputtering, and the like.

In the formation of the first conductive layer by the electroless nickel plating treatment, a zincate conversion treatment is performed on the Al electrode 2 by the use of an alkaline zinc solution. That is, the surface of aluminum (Al electrode 2) is converted to zinc. In order to apply the alkaline zinc solution to the Al electrode 2, the semiconductor element 1 may be immersed in the solution. In order to deposit zinc on the surface of the Al electrode 2, the Al electrode 2 may be immersed in the alkaline zinc solution, deposited zinc may be dissolved in nitric acid and, thereafter, the Al electrode 2 may be immersed in the alkaline zinc solution again. An electroless nickel plating solution is applied to the Al electrode 2 with the surface converted to zinc, so that a nickel layer is formed on the Al electrode 2 through the substitution reaction between zinc and nickel. This step is performed while the semiconductor element 1 is immersed in the electroless nickel plating solution. Subsequently, the above-described resin layer 4*a* is formed, and the second conductive layer is formed. This second conductive layer is formed by patterning in order to connect the surface of the protrusion and the first conductive layer. The removal of the resin layer 4*a* by a plasma treatment performed following this is similar to that in the above-described embodiment.

In the present embodiment, since the Al electrode 2 is completely covered with the first conductive layer, corrosion of Al can be prevented. In addition, since the zincate conversion treatment is performed, the resist patterning for selectively applying Ni to the Al portion is unnecessary.

On the other hand, in the formation of the first conductive layer by the sputtering, the resist patterning is performed after the sputter film is formed, and the etching treatment and the resist peeling are performed, as in the above-described embodiment, so that the first conductive layer in a desired shape can be prepared (plating treatment may be performed). The steps following this are similar to those in the case where the electroless nickel plating treatment is performed.

In the present embodiment, as in the electroless nickel plating treatment, corrosion of Al can be prevented and, in addition, since the first conductive layers can be extended to the active surface region of the semiconductor element 1, flexibility in disposition of the protrusions 4 can be further increased.

Figure 5:
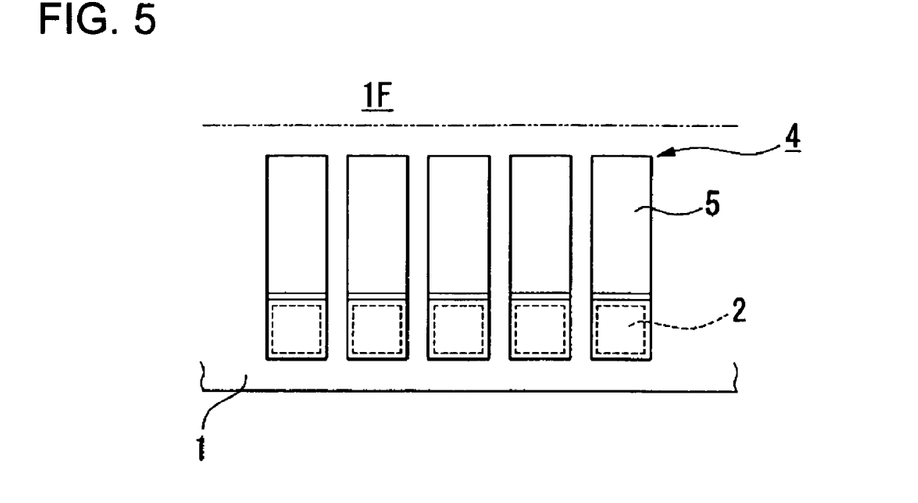
FIG. 5 is a partial plan view showing another form of the semiconductor device.

In the configuration of the above-described embodiment, the protrusions are extended to the active surface region of the semiconductor element 1, although not limited to this. For example, as shown in FIG. 5, the protrusions 4 may be configured to simply extend to the vicinity of the outside edge of the active surface region 1F of the semiconductor element 1 in accordance with the Al electrodes 2 having small openings.

Figure 6:
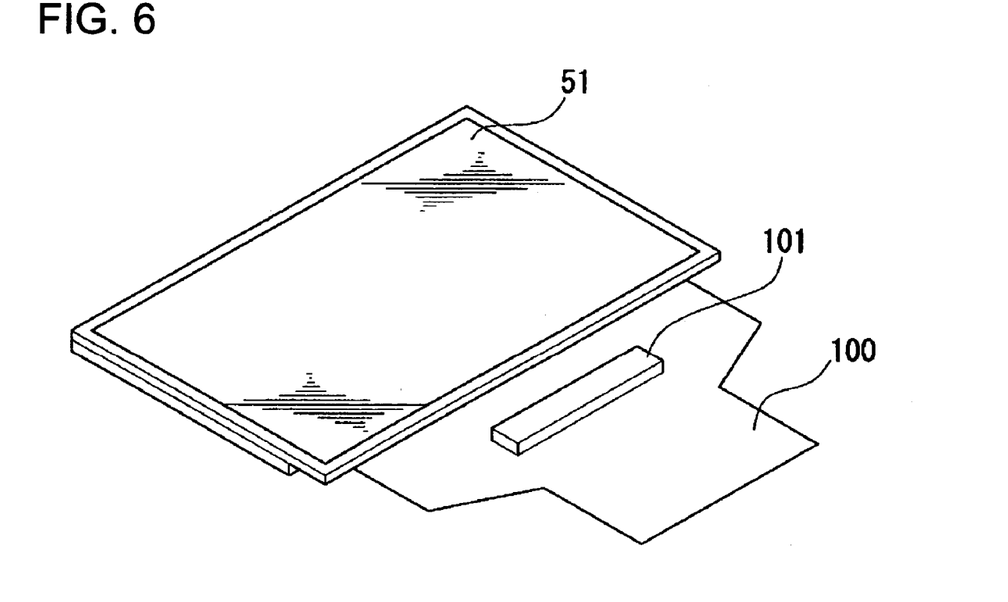
FIG. 6 is a perspective view showing a schematic configuration of a liquid crystal display device according to the present invention.

FIG. 6 is a perspective view showing a schematic configuration of a liquid crystal display device for serving as the electro-optical apparatus according to an embodiment of the present invention. The liquid crystal display device shown in FIG. 6 is provided with a color liquid crystal panel 51 for serving as the electro-optical panel and a COF (Chip On Film) type circuit substrate 100 which includes a semiconductor device 101 manufactured by the above-described method for manufacturing a semiconductor device and which is connected to the liquid crystal panel 51. If necessary, illumination devices, e.g., a backlight, and other accessory devices are attached to the liquid crystal panel 51.

Figure 7:
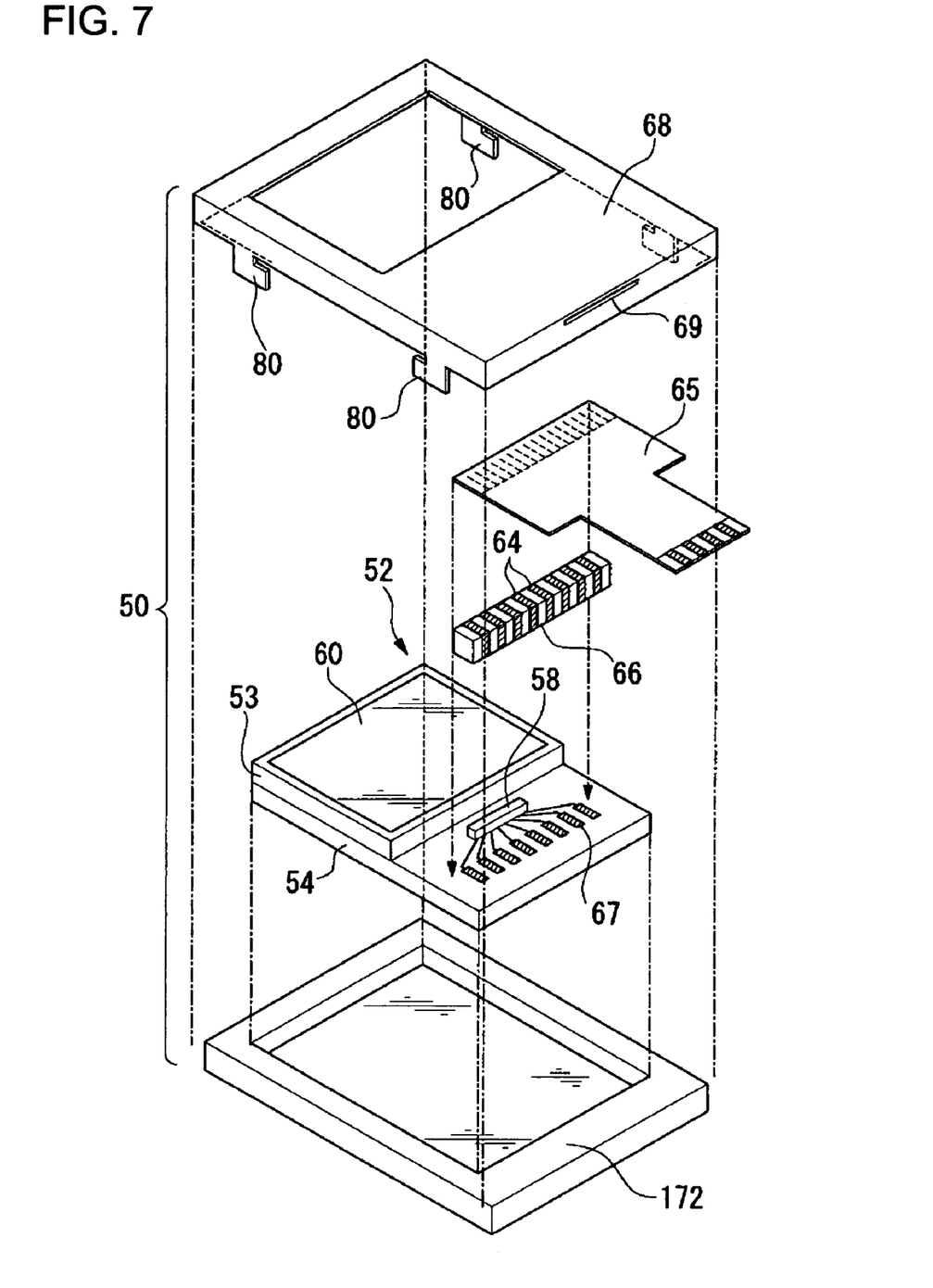
FIG. 7 is a perspective exploded view showing an example of a COG type liquid crystal display device.

In addition to the above-described COF, the present invention may be applied to a COG (Chip On Glass) type electro-optical apparatus in which a driver IC and the like are directly mounted on a display panel (liquid crystal panel). FIG. 7 shows an example of the COG type liquid crystal display device.

In this drawing, a liquid crystal display device 50 for serving as the electro-optical apparatus includes a frame-shaped shield case 68 made of a metal plate, a liquid crystal panel 52 for serving as the electro-optical panel, a liquid crystal driving LSI 58, an ACF (Anisotropic Conductive Film) or a NCF(Non Conductive Film), although not shown in the drawing, for electrically connecting the liquid crystal panel 52 and bump provided on the active surface of the liquid crystal driving LSI 58 to each other by a COG mounting system, and a holding element 172 for ensuring the strength of the whole assembly.

This liquid crystal panel 52 has a configuration in which a first substrate 53 is composed of 0.7 mm thick soda glass provided with a first transparent electrode layer on one surface, a second substrate 54 is composed of 0.7 mm thick soda glass provided with a second transparent electrode layer on one surface, the first substrate 53 and the second substrate 54 are attached to each other in order that the first transparent electrode layer and the second transparent electrode layer face each other, and a liquid crystal composition is enclosed between these substrates. The liquid crystal driving LSI 58 is directly, electrically connected to one substrate 54 by the use of the ACF or the NCF for COG. In this manner, the COG type liquid crystal panel 52 is formed. The liquid crystal driving LSI 58 is manufactured by the above-described method for manufacturing a semiconductor device.

Figure 8:
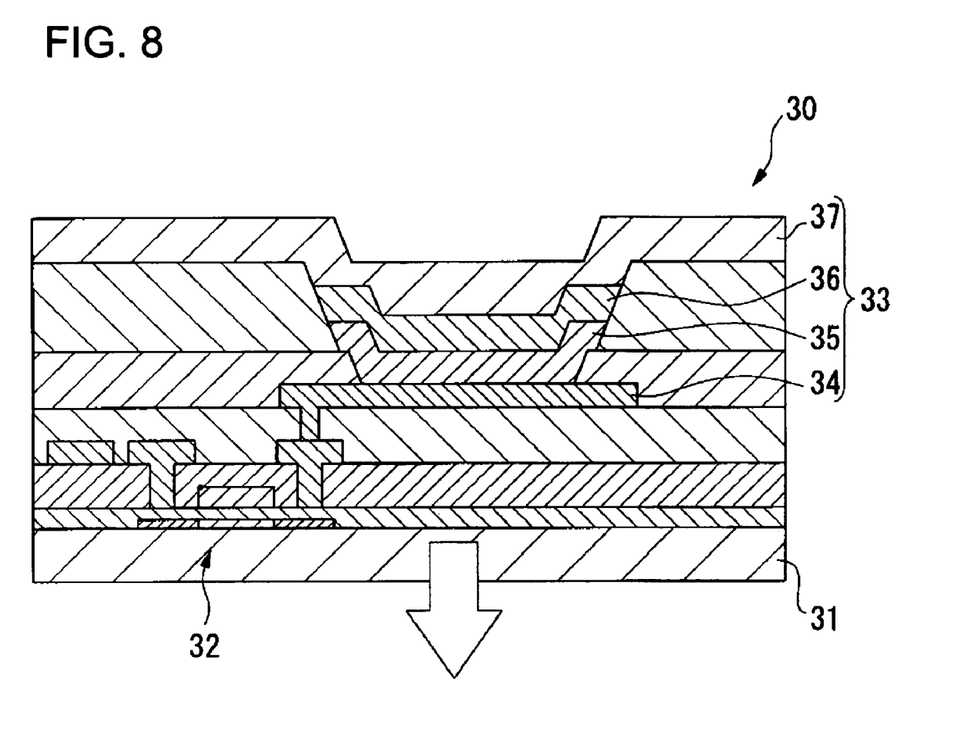
FIG. 8 is a sectional view of an organic EL panel according to the present invention.

In addition to the liquid crystal display device, an organic EL display device may also be used as the electro-optical apparatus. FIG. 8 is a sectional view of an organic EL panel provided on the organic EL display device for serving as the electro-optical apparatus according to the present invention.

In the rough configuration of the organic EL panel (electro-optical panel) 30, TFTs (Thin Film Transistors) 32 are provided in the matrix on a substrate 31, and a plurality of laminates 33 are further provided thereon. The TFT 32 includes a source electrode, a gate electrode, and a drain electrode, and each of the gate electrode and the source electrode is electrically connected to, for example, one of the conductive layers 5 shown in FIG. 1. The above-described laminate 33 is configured to include an anode layer 34, a hole injection layer 35, a luminescent layer 36, and a cathode layer 37. The above-described anode layer 34 is connected to the drain electrode of the TFT 32, and a current is supplied to the anode layer 34 via the source electrode and the drain electrode of the TFT 32 when the TFT 32 is in an on state.

In the organic EL panel 30 having the above-described configuration, the light generated in the luminescent layer 36 by recombination of a hole injected from the anode layer 34 to the luminescent layer 36 via the hole injection layer 35 and an electron injected from the cathode layer 37 to the luminescent layer 36 is emitted from the substrate 31 side.

The method for manufacturing a semiconductor device, the circuit substrate, and the electro-optical apparatus according to the embodiments of the present invention are described above. Electronic equipment including the electro-optical apparatus of the present embodiment will be described. Electronic components, such as a liquid crystal display device for serving as the above-described electro-optical apparatus, a mother board provided with a CPU (central processing unit) and the like, a keyboard, and hard disk, are installed into a cabinet and, therefore, a notebook personal computer 60 (electronic equipment) shown in FIG. 9, for example, is prepared.

Figure 9:
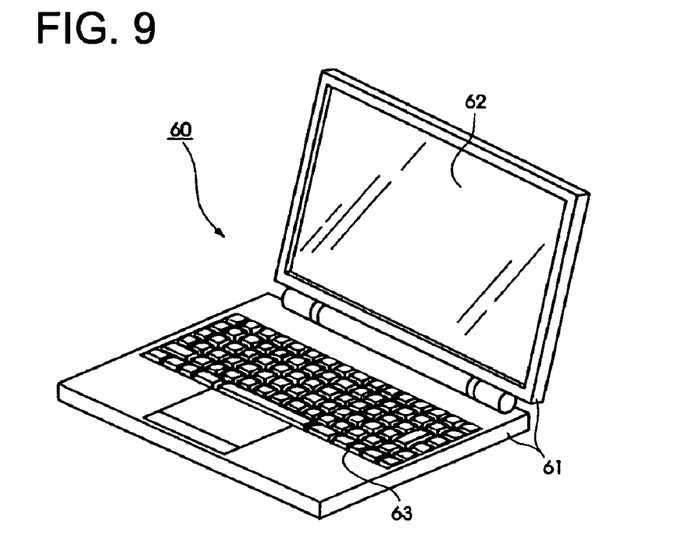
FIG. 9 is an external view of an electronic equipment of the present invention.
Figure 10:
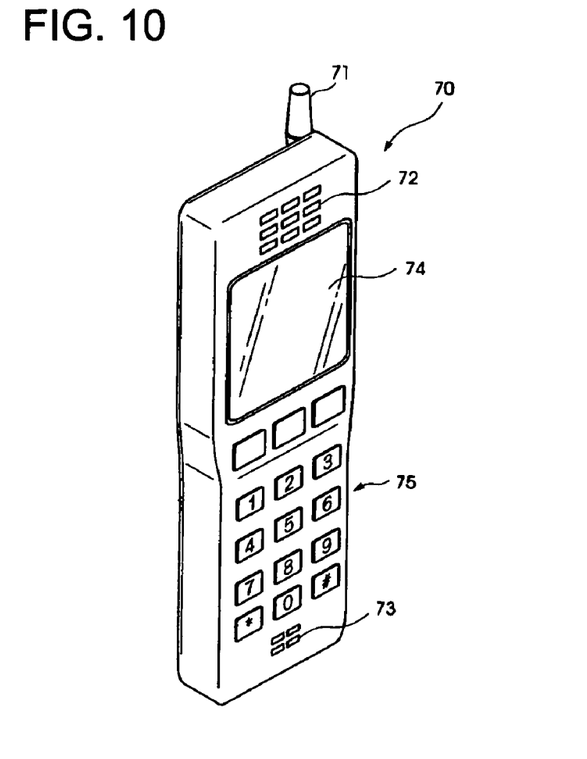
FIG. 10 is a perspective view showing a cellular phone serving as another electronic equipment of the present invention.

FIG. 9 is an external view showing a notebook computer for serving as the electronic equipment according to an embodiment of the present invention. In FIG. 9, reference numeral 61 denotes a cabinet, reference numeral 62 denotes a liquid crystal display device (electro-optical apparatus), and reference numeral 63 denotes a keyboard. Although the notebook computer provided with the liquid crystal display device is shown in FIG. 9, an organic EL display device may be included instead of the liquid crystal display device. FIG. 10 is a perspective view showing a liquid crystal display device (electro-optical apparatus) for serving as another electronic equipment. A cellular phone 70 shown in FIG. 10 is configured to include an antenna 71, an earpiece 72, a mouthpiece 73, a liquid crystal display device 74, an operation button portion 75, and the like. The cellular phone shown in FIG. 10 may be configured to include an organic EL display device instead of the liquid crystal display device 74 as well.

In the above-described embodiments, the notebook computer and the cellular phone are described as examples of the electronic equipment, although the present invention is not limited to these. The present invention may be applied to electronic equipment, e.g., liquid crystal projectors, multi-media-capable personal computers (PC) and engineering work stations (EWS), pagers, word processors, televisions, viewfinder type and monitor-direct-view type videotape recorders, electronic notepads, electronic desk-top calculators, car navigation devices, POS terminals, and devices provided with touch panels, among others.

The semiconductor device, the method for manufacturing the same, the electro-optical apparatus, and the electronic equipment according to the embodiments of the present invention are described above. However, the present invention is not limited to the above-described embodiments, and many modifications within the scope of the present invention may be performed.

For example, electronic components may be prepared by replacing the "semiconductor chip" and the "semiconductor element" in the above-described embodiments with the "electronic element". Examples of electronic components prepared using such an electronic component include optical elements, resistors, capacitors, coils, oscillators, filters, temperature sensors, thermistors, varistors, volumes, and fuses.

The entire disclosure of Japanese Patent Application No. 2002-350337 filed Dec. 2, 2002 is incorporated by reference.

What is claimed is:

1. A method for manufacturing a semiconductor comprising:

forming a plurality of electrodes on portions of a semiconductor element forming a first conductive layer by electroless nickel plating on the plurality of the electrodes before applying a layer of a resin in a subsequent step;

applying the layer of the resin to the semiconductor element in a region of the semiconductor element that does not include the electrodes, the layer of the resin being applied such that a height of the layer of the resin is greater than a height of the electrodes;

forming a second conductive layer over the plurality of the electrodes and the layer of the resin, the second conductive layer being connected to the first conductive layer and covering a top surface of the layer of the resin;

patterning the second conductive layer on the electrodes and the layer of the resin in a predetermined pattern; and removing portions of the layer of the resin using the patterned second conductive layer as a mask so that remaining portions of the layer of the resin form a plurality of protrusions.

2. The method for manufacturing a semiconductor device according to claim 1, wherein the layer of the resin is removed by plasma processing.

3. The method for manufacturing a semiconductor device according to claim 1, wherein the second conductive layer is formed by sputtering.

4. The method for manufacturing a semiconductor device according to claim 1, wherein the second conductive layer is formed by plating.

* * * * *